(12) United States Patent
Migita

(10) Patent No.: US 10,668,812 B2
(45) Date of Patent: Jun. 2, 2020

(54) POWER SUPPLY SYSTEM

(71) Applicant: TOYOTA JIDOSHA KABUSHIKI KAISHA, Toyota-shi, Aichi-ken (JP)

(72) Inventor: Tsubasa Migita, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 231 days.

(21) Appl. No.: 15/726,767

(22) Filed: Oct. 6, 2017

(65) Prior Publication Data

US 2018/0105043 A1 Apr. 19, 2018

(30) Foreign Application Priority Data

Oct. 13, 2016 (JP) ................. 2016-201739

(51) Int. Cl.
*G01R 31/387* (2019.01)
*B60L 3/00* (2019.01)
(Continued)

(52) U.S. Cl.
CPC ............. *B60L 3/0046* (2013.01); *B60L 50/15* (2019.02); *G01R 31/387* (2019.01); *G01R 31/42* (2013.01); *G01R 31/50* (2020.01); *H02M 3/155* (2013.01); *H02M 7/537* (2013.01); *B60L 2210/14* (2013.01); *B60L 2210/42* (2013.01); *G01R 31/3835* (2019.01); *Y02T 10/646* (2013.01); *Y02T 10/7005* (2013.01);
(Continued)

(58) Field of Classification Search
CPC .......... B60L 3/0046; B60L 3/00; B60L 50/15; B60L 2210/42; B60L 2210/14; G01R 31/50; G01R 31/42; G01R 31/387; G01R 31/3835; H02M 7/537; H02M 3/155; H02M 7/48; Y02T 10/7077; Y02T 10/7005; Y02T 10/7241; Y02T 10/7022; Y02T 10/646; Y02T 10/7225
See application file for complete search history.

(56) References Cited

U.S. PATENT DOCUMENTS

| 2004/0026140 | A1* | 2/2004 | Suzuki | ................... | B60K 6/485 |
| | | | | | 180/65.26 |
| 2013/0175857 | A1* | 7/2013 | Shreevani | ............... | H02J 7/345 |
| | | | | | 307/9.1 |

(Continued)

FOREIGN PATENT DOCUMENTS

| JP | 2005-192324 | | 7/2005 |
| JP | 2006174522 | A * | 6/2006 |

(Continued)

*Primary Examiner* — Pinping Sun
(74) *Attorney, Agent, or Firm* — Finnegan, Henderson, Farabow, Garrett & Dunner, LLP

(57) ABSTRACT

There is provided a power supply system that is mounted on a vehicle and that comprises an accumulator connected with a power line via a system main relay including a precharge circuit; a smoothing capacitor mounted to the power line; and a power converter configured to use a DC power from the power line and supply an AC power to an electric load. When a precharge control that uses the precharge circuit to pre-charge the capacitor at a system start time fails in pre-charging the capacitor, the power supply system diagnoses a place of a failure, based on a change in common voltage of the accumulator during the precharge control.

8 Claims, 5 Drawing Sheets

(51) Int. Cl.
*B60L 50/15* (2019.01)
*G01R 31/42* (2006.01)
*G01R 31/50* (2020.01)
*H02M 3/155* (2006.01)
*H02M 7/537* (2006.01)
*G01R 31/3835* (2019.01)

(52) U.S. Cl.
CPC ........ *Y02T 10/7022* (2013.01); *Y02T 10/7077* (2013.01); *Y02T 10/7225* (2013.01); *Y02T 10/7241* (2013.01)

(56) References Cited

U.S. PATENT DOCUMENTS

| | | | | |
|---|---|---|---|---|
| 2014/0197683 | A1* | 7/2014 | Migita | B60L 3/0046 307/9.1 |
| 2015/0185271 | A1* | 7/2015 | Kim | G01R 31/028 324/551 |
| 2016/0146901 | A1* | 5/2016 | Ohta | G01R 31/3278 324/538 |

FOREIGN PATENT DOCUMENTS

| | | | |
|---|---|---|---|
| JP | 2007-89240 | | 4/2007 |
| JP | 2009171645 A | * | 7/2009 |
| JP | 2016-129460 | | 7/2016 |
| KR | 20140072522 A | * | 6/2014 |

* cited by examiner

POWER SUPPLY SYSTEM

This application claims priority to Japanese Patent Application No. 2016-201739 filed 13 Oct. 2016, the contents of which is incorporated herein by reference.

TECHNICAL FIELD

The present disclosure relates to a power supply system and more specifically a power supply system mounted on a vehicle and configured to precharge a smoothing capacitor at a system start time.

BACKGROUND

A proposed configuration of the power supply system includes a battery that is connected with a battery voltage-system power line via a system main relay, a first capacitor mounted to a first power line, an inverter configured to convert a DC power of a second power line to a three-phase AC power and supply the three-phase AC power to a motor, a second capacitor mounted to the second power line, and a step-up/down converter connected with both the first power line and the second power line (for example, JP 2016-129460A). The power supply system of this configuration uses a precharge circuit included in a system main relay to pre-charge the first capacitor and the second capacitor at a system start time, and, in the case of an abnormality of power consumption during pre-charging, diagnoses the place of an abnormality based on a battery voltage, a voltage of the first capacitor, a voltage of the second capacitor and a voltage of an auxiliary machine.

SUMMARY

In the power supply system of the above configuration, inability to pre-charge the first capacitor and the second capacitor at the system start time may be attributed to a failure caused by, for example, disconnection of the first power line or to a failure caused by, for example, disconnection on the inverter side of the second power line. In this case, the place of a failure may be diagnosed and stored, and the stored place of a failure may be read out to be used for a subsequent repair.

The power supply system of the present disclosure thus mainly aims to diagnose the place of a failure in the case of inability to pre-charge a capacitor at a system start time.

In order to achieve the above object, the power supply system of the present disclosure is implemented by aspects described below.

According to one aspect of the present disclosure, there is provided a power supply system comprising: an accumulator connected with a power line via a system main relay that includes a precharge circuit; a smoothing capacitor mounted to the power line; a power converter configured to use a DC power from the power line and supply an AC power to an electric load; and a control device configured to perform a precharge control that uses the precharge circuit to pre-charge the capacitor at a system start time, wherein when the precharge control fails in pre-charging the capacitor, the control device diagnoses a place of a failure, based on a change in common voltage of the accumulator during the precharge control.

The power supply system of this aspect pre-charges the capacitor mounted to the power line with electric power of the accumulator by using the precharge circuit included in the system main relay configured to connect the accumulator with the power line at a system start time. When the precharge control fails in pre-charging the capacitor, the power supply system of this aspect diagnoses the place of a failure, based on a change in the common voltage of the accumulator during the precharge control. When inability to pre-charge the capacitor is attributed to a failure caused by disconnection, the common voltage is changed according to the place of the failure caused by disconnection. The power supply system of this aspect accordingly diagnoses the place of a failure, based on the change in the common voltage.

DESCRIPTION OF EMBODIMENTS

Figure 1:
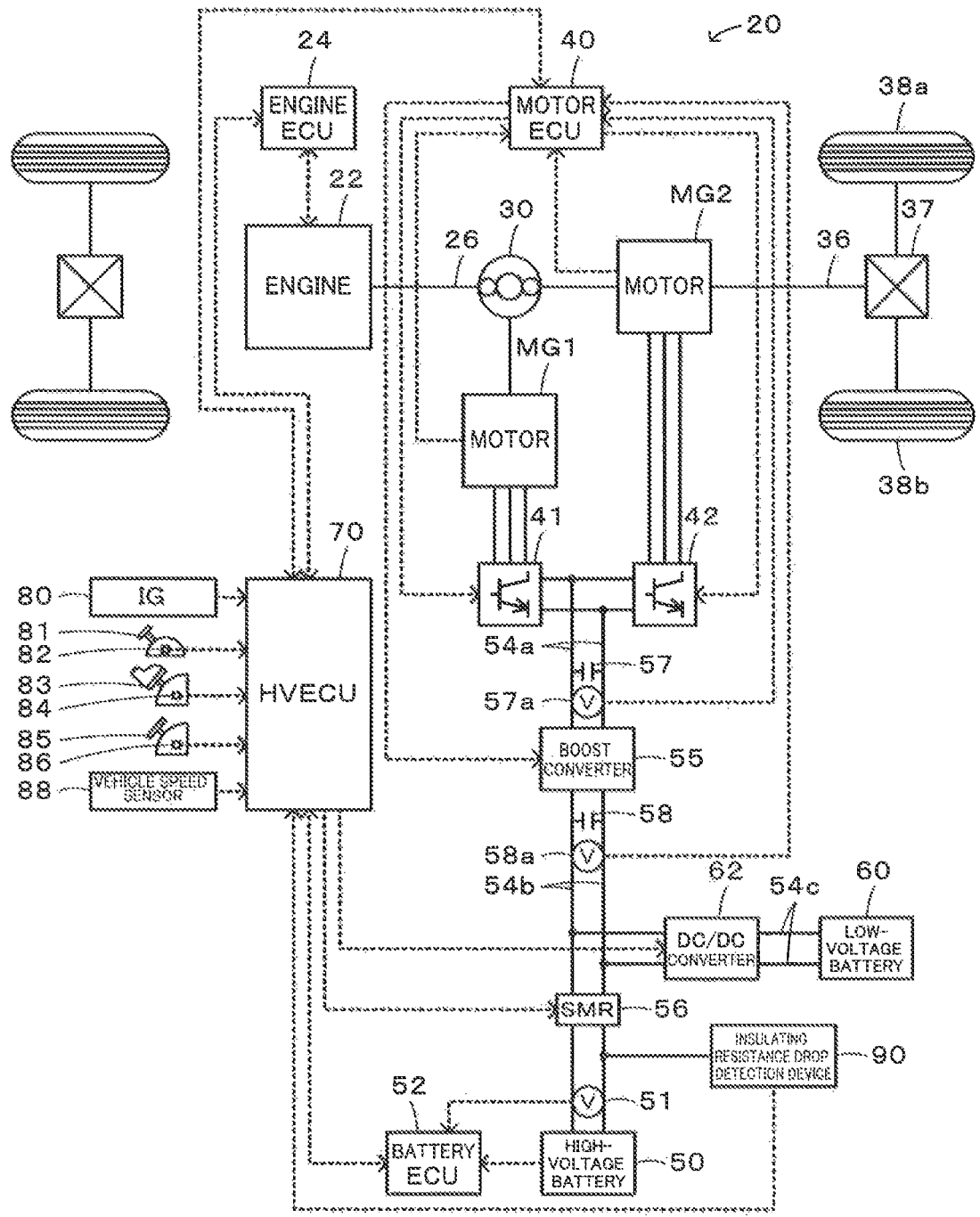
FIG. 1 is a configuration diagram illustrating the configuration of a hybrid vehicle equipped with a power supply system according to one embodiment of the present disclosure.
Figure 2:
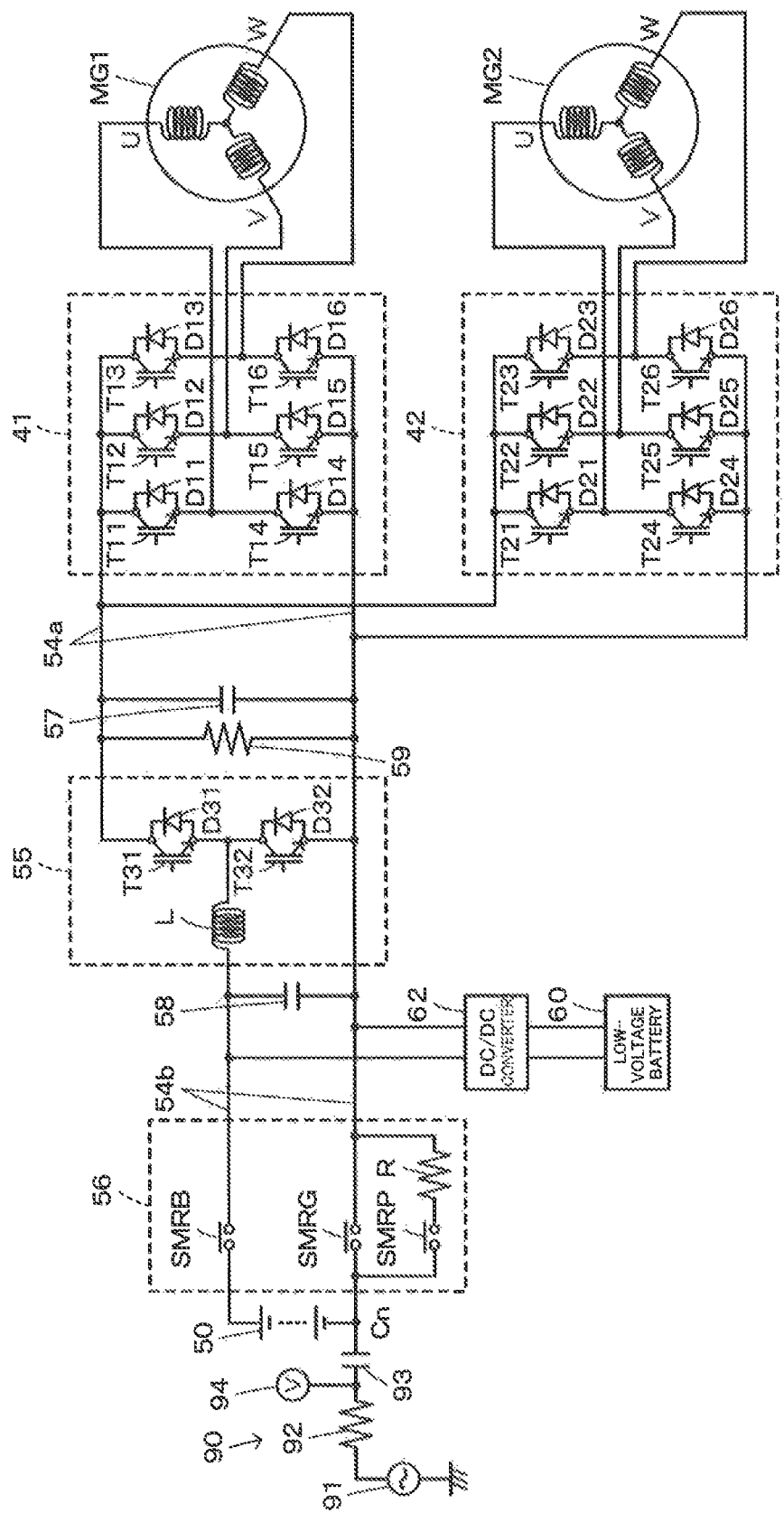
FIG. 2 is a configuration diagram illustrating the schematic configuration of an electric drive system including motors MG1 and MG2.

The following describes some aspects of the present disclosure with reference to an embodiment. FIG. 1 is a configuration diagram illustrating the schematic configuration of a hybrid vehicle 20 equipped with a power supply system according to an embodiment of the present disclosure. FIG. 2 is a configuration diagram illustrating the schematic configuration of an electric drive system including motors MG1 and MG2. As shown in FIG. 1, the hybrid vehicle 20 of the embodiment includes an engine 22, a planetary gear 30, motors MG1 and MG2, inverters 41 and 42, a boost converter 55, a high-voltage battery 50, a system main relay 56, a low-voltage battery 60, a DC-DC converter 62, an insulating resistance drop detection device 90 and a hybrid electronic control unit (hereinafter referred to as HVECU) 70.

The engine 22 is configured as an internal combustion engine to output power using, for example, gasoline or light oil as a fuel. This engine 22 is operated and controlled by an engine electronic control unit (hereinafter referred to as engine ECU) 24.

The engine ECU 24 is configured as a CPU-based microprocessor and includes a ROM configured to store processing programs, a RAM configured to temporarily store data, input/output ports and a communication port, in addition to the CPU, although not being illustrated. The engine ECU 24 obtains signals input from various sensors required for operation control of the engine 22 via the input port, for example, a crank angle θcr from a crank position sensor configured to detect the rotational position of a crankshaft 26. The engine ECU 24 outputs various control signals for the operation control of the engine 22 via the output port. The engine ECU 24 is connected with the HVECU 70 via the respective communication ports and serves to operate and control the engine 22 in response to the control signals from the HVECU 70 and to output data regarding the operating conditions of the engine 22 to the HVECU 70 as needed basis. The engine ECU 24 calculates a rotation speed of the crankshaft 26, i.e., a rotation speed Ne of the engine 22, based on the crank angle θcr input from the crank position sensor.

The planetary gear 30 is configured as a single pinion-type planetary gear mechanism. The planetary gear 30 includes a sun gear, a ring gear and a carrier that are respectively connected with a rotor of the motor MG1, with a driveshaft 36 that is coupled with drive wheels 38a and 38b via a differential gear 37, and with the crankshaft 26 of the engine 22.

The motor MG1 is configured as a synchronous motor generator having a rotor with permanent magnets embedded therein and a stator with three-phase coils wound thereon. As described above, the rotor is connected with the sun gear of the planetary gear 30. The motor MG2 is also configured as a synchronous motor generator like the motor MG1 and includes a rotor that is connected with the driveshaft 36.

As shown in FIG. 2, the inverter 41 is connected with drive voltage-system power lines 54a. This inverter 41 is configured to include six transistors T11 to T16 and six diodes D11 to D16 that are connected in parallel in a reverse direction with the transistors T11 to T16. The transistors T11 to T16 are arranged in pairs, such that two transistors in each pair respectively serve as a source and a sink relative to a positive electrode line and a negative electrode line of the drive voltage-system power lines 54a. The respective phases of the three-phase coils (U phase, V phase and W phase) of the motor MG1 are connected with connection points of the respective pairs of the transistors T11 to T16. Accordingly, when a voltage is applied to the inverter 41, a motor electronic control unit (hereinafter referred to as motor ECU) 40 serves to regulate the rates of ON times of the respective pairs of the transistors T11 to T16, such as to provide a rotating magnetic field in the three-phase coils and thereby rotate and drive the motor MG1. Like the inverter 41, the inverter 42 includes six transistors T21 to T26 and six diodes D21 to D26. When a voltage is applied to the inverter 42, the motor ECU 40 serves to regulate the rates of ON times of the respective pairs of the transistors T21 to T26, such as to provide a rotating magnetic field in the three-phase coils and thereby rotate and drive the motor MG2.

As shown in FIG. 2, the boost converter 55 is connected with the drive voltage-system, power lines 54a that are connected with the inverters 41 and 42 and with battery voltage-system power lines 54b that are connected with the high-voltage battery 50. This boost converter 55 includes two transistors T31 and T32, two diodes D31 and D32 that are connected in parallel in a reverse direction with the transistors T31 and T32, and a reactor L. The transistor T31 is connected with the positive electrode line of the drive voltage-system power lines 54a. The transistor T32 is connected with the transistor T31 and with negative electrode lines of the drive voltage-system power lines 54a and the battery voltage-system power lines 54b. The reactor L is connected with a connection point between the transistors T31 and T32 and with a positive electrode line of the battery voltage-system power lines 54b. The boost converter 55 serves to step up an electric power of the battery voltage-system power lines 54b and supply the stepped-up electric power to the drive voltage-system power lines 54a and to step down an electric power of the drive voltage-system power lines 54a and supply the stepped-down electric power to the battery voltage-system power lines 54b in response to ON and OFF of the transistors T31 and T32 by the motor ECU 40. A smoothing capacitor 57 is attached to the positive electrode power lines 54a, and a smoothing capacitor 58 is attached to the positive electrode line and the negative electrode line of the battery voltage-system power lines 54b. A discharge resistance 59 is attached to the positive electrode line and the negative electrode line of the drive voltage-system power lines 54a.

The motor ECU 40 is configured as a CPU-based microprocessor and includes a ROM configured to store processing programs, a RAM configured to temporarily store data, input/output ports and a communication port, in addition to the CPU, although not being illustrated. As shown in FIG. 1, the motor ECU 40 obtains signals input from various sensors required for drive control of the motors MG1 and MG2 and the boost converter 55 via the input port, for example, rotational positions θm1 and θm2 from rotational position detection sensors configured to detect the rotational positions of the respective rotors of the motors MG1 and MG2, phase currents from current sensors configured to detect electric currents flowing in the respective phases of the motors MG1 and MG2, a voltage VH of the capacitor 57 (hereinafter called drive voltage-system capacitor voltage) from a voltage sensor 57a placed between terminals of the capacitor 57 and a voltage VL of the capacitor 58 (hereinafter called battery voltage-system capacitor voltage) from a voltage sensor 58a placed between terminals of the capacitor 58. The motor ECU 40 outputs via the output port, for example, switching control signals to the transistors T11 to T16 of the inverter 41 and the transistors T21 to T26 of the inverter 42 and switching control signals to the transistors T31 and T32 of the boost converter 55. The motor ECU 40 is connected with the HVECU 70 via the respective communication ports and serves to drive and control the motors MG1 and MG2 and the boost converter 55 in response to the control signals from the HVECU 70 and to output data regarding the driving conditions of the motors MG1 and MG2 and the boost converter 55 to the HVECU 70 as needed basis. The motor ECU 40 calculates rotation speeds Nm1 and Nm2 of the respective motors MG1 and MG2, based on the rotational positions θm1 and θm2 of the respective rotors of the motors MG1 and MG2 input from the rotational position detection sensors. The motor ECU 40, as well as the boost converter 55 and the inverters 41 and 42 constitute a power control unit PCU and are placed in a single housing.

The high-voltage battery 50 is configured as a lithium ion rechargeable battery or a nickel metal hydride battery of, for example, 200 V or 250 V and is connected with the battery voltage-system power lines 54b as described above. This high-voltage battery 50 is under management, of a battery electronic control unit (hereinafter referred to as battery ECU) 52.

The battery ECU 52 is configured as a CPU-based microprocessor and includes a ROM configured to store processing programs, a RAM configured to temporarily store data, input/output ports and a communication port, in addition to the CPU, although not being illustrated. The battery ECU 52 obtains input, signals required for management of the high-voltage battery 50 via the input port, for example, a battery voltage VB from a voltage sensor 51 placed between terminals of the high-voltage battery 50, a battery current Ib from a current sensor attached to a power line connected with an output terminal of the high-voltage battery 50, and a battery temperature Tb from a temperature sensor attached to the high-voltage battery 50. The battery ECU 52 is connected with the HVECU 70 via the respective communication ports and serves to output data regarding the conditions of the high-voltage battery 50 to the HVECU 70 as needed basis. For the purpose of management of the high-voltage battery 50, the battery ECU 52 calculates a state of charge SOC that denotes a ratio of the capacity of electric power dischargeable from the high-voltage battery 50 to the overall capacity of the high-voltage battery 50, based on an integrated value of the voltage current Ib detected by the current sensor, and calculates an input limit Win and an output limit Wout that denote maximum allowable powers to charge the high-voltage battery 50 and to be discharged from the high-voltage battery 50, based on the calculated state of charge SOC and the battery temperature Tb detected by the temperature sensor.

As shown in FIG. 2, the system main relay 56 is provided on a high voltage battery 50-side of the capacitor 58 on the battery voltage-system, power lines 54b. This system main relay 56 includes a positive electrode-side relay SMRB provided on the positive electrode line of the battery voltage-system power lines 54b, a negative electrode-side relay SMRG provided on the negative electrode line of the battery voltage-system power lines 54b, and a precharge circuit configured by connecting a precharge resistance R with a precharge relay SMRP in series such as to bypass the negative electrode-side relay SMRG. This system main relay 56 is turned on and off by the HVECU 70.

The low-voltage battery 60 is configured, as a lead acid battery of, for example, 12V and is connected, along with low voltage auxiliary machines (not shown), with power lines (hereinafter referred to as low voltage-system power lines) 54c. The DC-DC converter 62 is connected with a boost converter 55-side of the system main relay 56 on the battery voltage-system power lines 54b and with the low voltage-system power lines 54c. This DC-DC converter 62 is controlled by the HVECU 70 to step down an electric power of the battery voltage-system power lines 54b and supply the stepped-down electric power to the low voltage-system power lines 54c and to step up an electric power of the low voltage-system power lines 54c and supply the stepped-up electric power to the battery voltage-system power lines 54b.

The insulating resistance drop detection device 90 is connected with a negative electrode terminal of the high-voltage battery 50. As shown in FIG. 2, this insulating resistance drop detection device 90 includes an oscillation power supply 91 having one end that is grounded, a detection resistance 52 having one terminal that is connected with the oscillation power supply 92, a coupling capacitor 93 having one terminal that is connected with the other terminal of the detection resistance 92 and having the other terminal that is connected with the negative electrode terminal of the high-voltage battery 50, and a voltage sensor 94 configured to detect a voltage at a connection between the detection resistance 92 and the coupling capacitor 93 and output the detected voltage to the HVECU 70.

Figure 3:
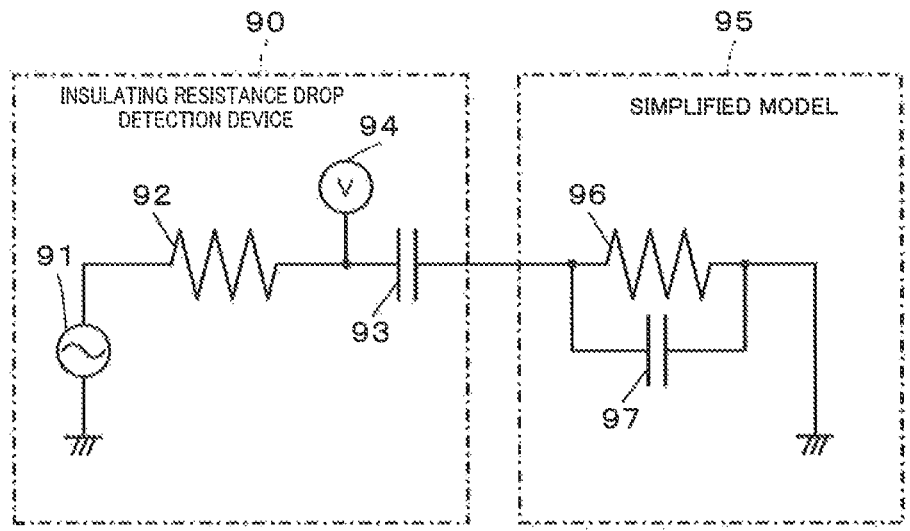
FIG. 3 is a diagram illustrating an insulating resistance drop detection device and a simplified model of a system that is connected with the insulating resistance drop detection device.

FIG. 3 is a diagram illustrating the insulating resistance drop detection device 90 and a simplified model 95 of a system that is connected with this insulating resistance drop detection device 90. The simplified model 95 denotes a circuit model of a connected portion of an entire high voltage system that is connected with the insulating resistance drop detection device 90 (hereinafter referred to as diagnosis target). According to this embodiment, the motors MG1 and MG2, the inverters 41 and 42, the high-voltage battery 50, the boost converter 55, the system main relay 56, the capacitors 57 and 58, the drive voltage-system power lines 54a and the battery voltage-system power lines 54b correspond to the high voltage system. The diagnosis target denotes the entire high voltage system when at least one of the positive electrode-side relay SMRB, the negative electrode-side relay SMRG and the precharge relay SMRP of the system main relay 56 is ON, and denotes a portion on a high voltage battery 50-side from the system main relay 56 (hereinafter referred to as battery portion) when ail the positive electrode-side relay SMRB, the negative electrode-side relay SMRG and the precharge relay SMRP of the system main relay 56 are OFF. This simplified model 95 is configured by an insulating resistance 96 having one terminal that is connected with the coupling capacitor 93 and having the other terminal that is grounded, and a common mode capacitor 97 connected in parallel with this insulating resistance 96. When the simplified model 95 has a large impedance, practically no electric current flows in the detection resistance 92. The voltage waveform detected by the voltage sensor 94 in this state is accordingly a voltage waveform having an amplitude approximately equal to the amplitude of the oscillation power supply 91. When the simplified model 95 has a small impedance, on the other hand, electric current flows in the detection resistance 92. The voltage waveform detected by the voltage sensor 94 in this state is accordingly a voltage waveform having a smaller amplitude than the amplitude of the oscillation power supply 91 by a voltage drop in the detection resistance 92. When there is substantially no decrease in the insulating resistance of the simplified model 95, the voltage sensor 94 outputs the voltage waveform having the amplitude approximately equal to the amplitude of the oscillation power supply 91, to the HVECU 70. When there is a decrease in the insulating resistance of the simplified model 95, on the other hand, the voltage sensor 94 outputs the voltage waveform having the smaller amplitude than the amplitude of the oscillation power supply 91, to the HVECU 70. A decrease in the insulating resistance relative to the vehicle body may be attributed to, for example, an extraneous substance such as metal, cooling water of an HV unit cooling device configured to cool down the motors MG1 and MG2 and the inverters 41 and 42, and rainwater.

The HVECU 70 is configured as a CPU-based microprocessor and includes a ROM configured to store processing programs, a RAM and a flash memory configured to temporarily store data, input/output ports and a communication port, in addition to the CPU, although not being illustrated. The HVECU 70 obtains via the input port, for example, a signal (voltage waveform) from the insulating resistance drop detection device 90, an ignition signal from an ignition switch 80, a shift position SP from a shift position sensor 82 configured to detect an operating position of a shift lever 81, an accelerator position Acc from an accelerator pedal position sensor 84 configured to detect a depression amount of an accelerator pedal 83, a brake pedal position BP from a brake pedal position sensor 86 configured to detect a depression amount of a brake pedal 85, and a vehicle speed V from a vehicle speed sensor 88. The HVECU 70 outputs, for example, an on-off control signal to the system main relay 56, via the output port. The HVECU 70 is connected with the engine ECU 24, the motor ECU 40 and the battery ECU 52 via the respective communication ports and serves to transmit various control signals and data to and from the engine ECU 24, the motor ECU 40 and the battery ECU 52 as described above. The HVECU 70 uses the output (amplitude of the voltage waveform) from the voltage sensor 94 and determines whether there is a decrease in the insulating resistance relative to the vehicle body as the diagnosis target (whether a decrease in the insulating resistance is detected) as described above.

According to this embodiment, a system configured to include the high-voltage battery 50, the system main relay 56, the battery voltage-system power lines 54*b*, the capacitor 58, the boost converter 55, the drive voltage-system power lines 54*a*, the capacitor 57, the inverters 41 and 42, the HVECU 70, the motor ECU 40, the battery ECU 52 and the insulating resistance drop detection device 90 corresponds to the power supply system.

The hybrid vehicle 20 of the embodiment having the above configuration is driven in a hybrid drive mode (HV drive) with operation of the engine 22 or in an electric drive mode (EV drive) without operation of the engine 22.

At a system start time, the hybrid vehicle 20 of the embodiment performs control (precharge control) that turns ON the positive electrode-side relay SMRB and the pre-charge relay SMRP of the precharge circuit in the system, main relay 56 and uses the electric power of the high-voltage battery 50 to pre-charge the capacitor 58 attached to the battery voltage-system power lines 54*b* and the capacitor 57 attached to the drive voltage-system, power lines 54*a*. When the battery voltage-system capacitor voltage VL and the drive voltage-system capacitor voltage VH are equal to or higher than a voltage (VB−α) that is obtained by subtracting a reference value α from the voltage VB of the high-voltage battery 50, the precharge control determines completion of pre-charging, turns ON the negative electrode-side relay SMRG of the system main relay 56 and turns OFF the precharge relay SMRP, and is then terminated. When one or both of the battery voltage-system capacitor voltage VL and the drive voltage-system capacitor-voltage VH are lower than the voltage (VB−α), on the other hand, the precharge control determines inability to pre-charge, stores the inability to pre-charge in a flash memory (not shown), and is then terminated. The reference value α used here may be a slightly larger value than a sensor error. The insulating resistance drop detection device 90 continuously outputs the voltage waveform detected by the voltage sensor 94 to the HVECU 70 even during such precharge control. The HVECU 70 stores the input voltage waveform as a monitored insulation value in a RAM (not shown).

Figure 4:
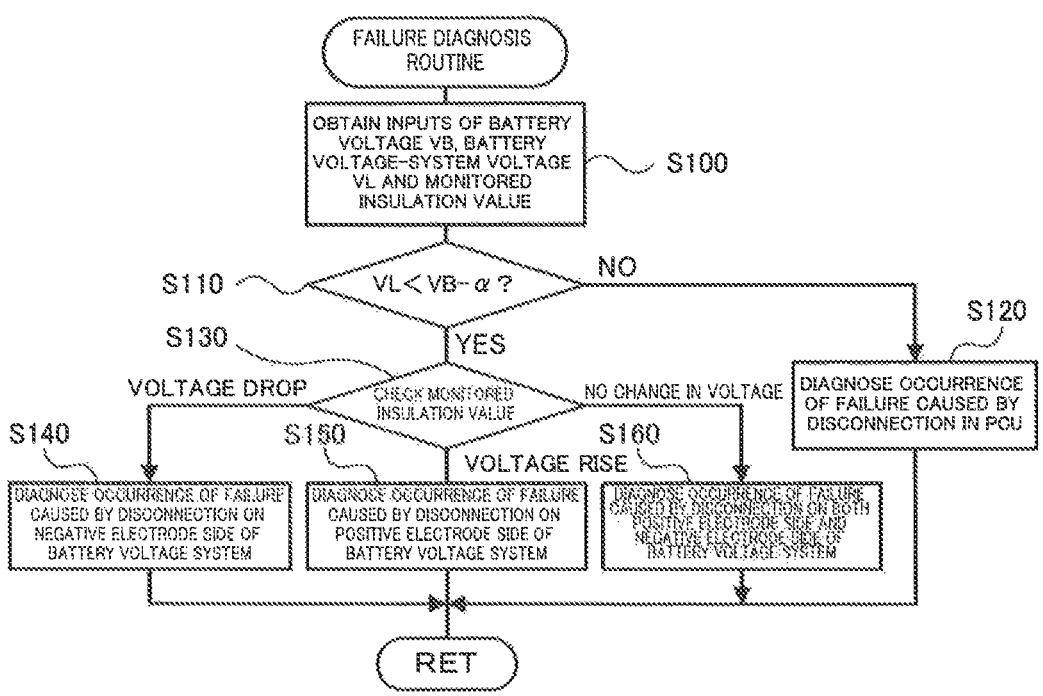
FIG. 4 is a flowchart showing one example of a failure diagnosis routine performed by an HVECU.

The following describes a failure diagnosis when the precharge control determines inability to pre-charge the capacitor 58 and the capacitor 57. FIG. 4 shows one example of a failure diagnosis routine performed by the HVECU 70. When the failure diagnosis routine is triggered, the HVECU 70 first obtains input data required for diagnosis, for example, the voltage VB of the high-voltage battery 50, the battery voltage-system capacitor voltage VL, and the monitored insulation value during precharge control (step S100). The voltage VB of the high-voltage battery 50 is the voltage VB detected by the voltage sensor 51 and input from the battery ECU 52 by communication. The battery voltage-system capacitor voltage VL is the voltage VL detected by the voltage sensor 58*a* and input from the motor ECU 40. The monitored insulation value input here is the monitored insulation value that is detected by the voltage sensor 94 of the insulating resistance drop detection device 90 for a time period between a start and an end of the precharge control and that is stored in the RAM (not shown).

The HVECU 70 subsequently determines whether the battery voltage-system capacitor voltage VL is lower than the voltage (VB−α) that is obtained by subtracting the reference value α from the voltage VB of the high-voltage battery 50 (step S110). When the battery voltage-system capacitor voltage VL is equal to or higher than the voltage (VB−α), the HVECU 70 determines a failure in pre-charging the capacitor 57 attached to the drive voltage-system power lines 54*a* as inability to pre-charge and diagnoses the occurrence of a failure caused by disconnection in the power control unit PCU (step S120), and then terminates this routine.

When it is determined at step S110 that the battery voltage-system capacitor voltage VL is lower than the voltage (VB−α), on the other hand, the HVECU 70 diagnoses the place of disconnection based on an overall change of the voltage in the voltage waveform detected by the voltage sensor 94 during the precharge control by using the monitored insulation value (steps S130 to S160) and then terminates this routine. In the case of an overall decrease of the voltage in the voltage waveform detected by the voltage sensor 94, the HVECU 70 diagnoses the occurrence of a failure caused by disconnection on the negative electrode side of the battery voltage system (i.e., a portion from the negative electrode of the high-voltage battery 50 to the capacitor 58) (step S140). In the case of an overall increase of the voltage in the voltage waveform detected by the voltage sensor 94, on the other hand, the HVECU 70 diagnoses the occurrence of a failure caused by disconnection on the positive electrode side of the battery voltage system (i.e., a portion from the positive electrode of the high-voltage battery 50 to the capacitor 58) (step S150). In the case of no overall change of the voltage in the voltage waveform detected by the voltage sensor 94, the HVECU 70 diagnoses the occurrence of a failure caused by disconnection, on both the positive electrode side and the negative electrode side of the battery voltage system (step S160). The result of diagnosis is stored in the flash memory and is read out at the time of a subsequent repair or the like. Such diagnosis is based on the following principle.

Figure 5:
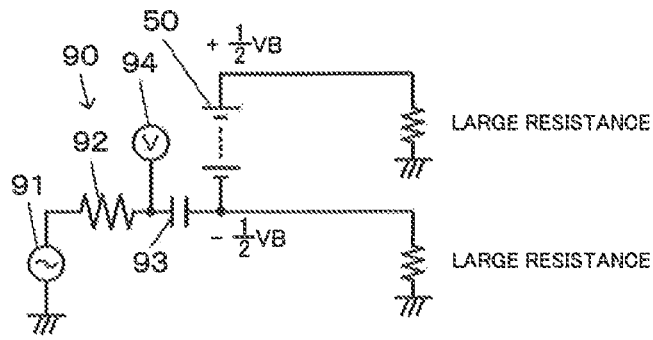
FIG. 5 is a circuit diagram during precharge when a failure caused by disconnection occurs on both a positive electrode side and a negative electrode side of a battery voltage system.
Figure 6:
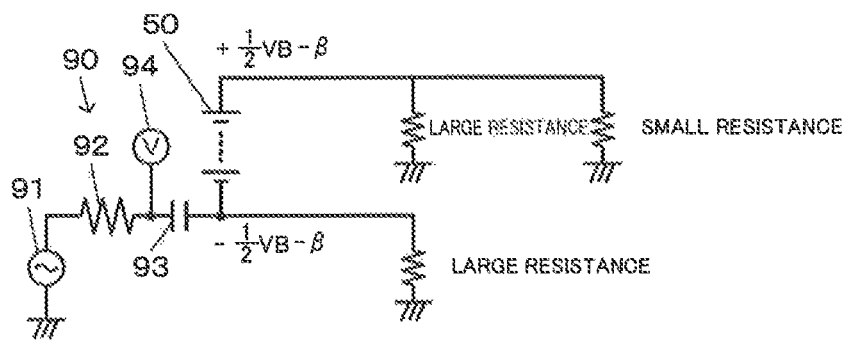
FIG. 6 is a circuit diagram during precharge when a failure caused by disconnection occurs on the negative electrode side of the battery voltage system.
Figure 7:
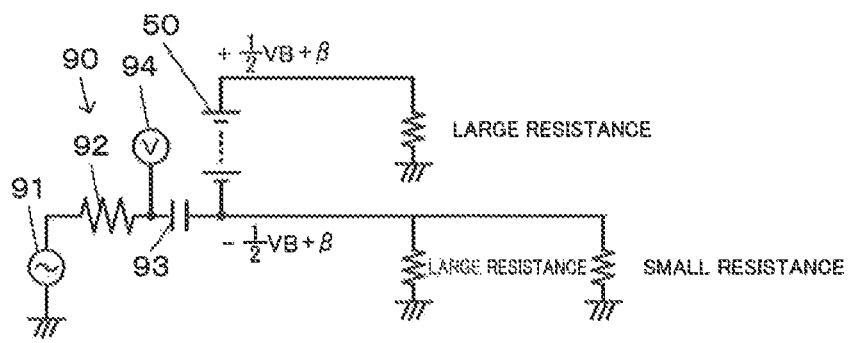
FIG. 7 is a circuit diagram during precharge when a failure caused by disconnection occurs on the positive electrode side of the battery voltage system.

FIG. 5 is a circuit diagram during precharge when a failure caused by disconnection occurs on both the positive electrode side and the negative electrode side of the battery voltage system. FIG. 6 is a circuit diagram during precharge when a failure caused by disconnect ion occurs on the negative electrode side of the battery voltage system. FIG. 7 is a circuit diagram during precharge when a failure caused by disconnection occurs on the positive electrode side of the battery voltage system. The voltages (common voltages) at the positive electrode and the negative electrode of the high-voltage battery 50 that is mounted on the vehicle are generally not grounded and are typically +VB/2 [V] and −VB/2 [V] prior to a system start. When precharge is performed on the occurrence of a failure caused by disconnection on both the positive electrode side and the negative electrode side of the battery voltage system, as shown in FIG. 5, both the positive electrode and the negative electrode of the high-voltage battery 50 are grounded via resistances of large resistance values. The voltages (common voltages) at the positive electrode and the negative electrode of the high-voltage battery 50 are accordingly not changed from the values prior to the system start and are kept at +VB/2 [V] and −VB/2 [V]. This does not provide an overall change of the voltage in the voltage waveform detected by the voltage sensor 94 of the insulating resistance drop detection device 30 from the value prior to the system start. When there is no overall change of the voltage in the voltage waveform detected by the voltage sensor 94 during the precharge control, the diagnosis shows that a failure caused by disconnection occurs on both the positive electrode side and the negative electrode side of the battery voltage system. When precharge is performed on the occurrence of a failure caused by disconnection on the negative electrode side of the battery voltage system, as shown in FIG. 6, the negative electrode of the high-voltage battery 50 is grounded via a resistance of a large resistance value, while the positive electrode is grounded via a resistance of a relatively small resistance value. The voltage (common voltage) at the positive electrode of the high-voltage battery 50 is accordingly dropped to approach the ground voltage (0 V). There is no change in the inter-terminal voltage of the high-voltage battery 50, so that the voltage (common voltage) at the negative electrode of the high-voltage battery 50 is also dropped to approach −VB [V]. In FIG. 6, "−β" indicates a drop of the common voltage. In this state, negative charges are accumulated on an electrode of the coupling capacitor 93 of the insulating resistance drop detection device 90 that is connected with the negative electrode terminal of the high-voltage battery 50, while positive charges are accumulated on a voltage sensor 94-side electrode. This provides an overall drop of the voltage in the voltage waveform detected by the voltage sensor 34. When there is an overall drop of the voltage in the voltage waveform detected by the voltage sensor 94 during the precharge control, the diagnosis shows that a failure caused by disconnection occurs on the negative electrode side of the battery voltage system. When precharge is performed on the occurrence of a failure caused by disconnection on the positive electrode side of the battery voltage system, on the other hand, as shown in FIG. 7, the positive electrode of the high-voltage battery 50 is grounded via a resistance of a large resistance value, while the negative electrode is grounded via a resistance of a relatively small resistance value. The voltage (common voltage) at the negative electrode of the high-voltage battery 50 is accordingly raised to approach the ground voltage (0 V). There is no change in the inter-terminal voltage of the high-voltage battery 50, so that the voltage (common voltage) at the positive electrode of the high-voltage battery 50 is also raised to approach VB [V]. In FIG. 7, "+β" indicates a rise of the common voltage. In this state, positive charges are accumulated on the electrode of the coupling capacitor 93 of the insulating resistance drop detection device 90 that is connected with the negative electrode terminal of the high-voltage battery 50, while negative charges are accumulated on the voltage sensor 94-side electrode. This provides an overall rise of the voltage in the voltage waveform detected by the voltage sensor 94. When there is an overall rise of the voltage in the voltage waveform detected by the voltage sensor 94 during the precharge control, the diagnosis shows that a failure caused by disconnection occurs on the positive electrode side of the battery voltage system.

In the power supply system mounted on the hybrid vehicle 20 according to the embodiment described above, in the case where the precharge control performed, at the system start time determines inability to pre-charge, when the battery voltage-system capacitor voltage VL is lower than the voltage (VB−α) that is obtained by subtracting the reference value α from the voltage VB of the high-voltage battery 50, the place of disconnection is diagnosed based on an overall change of the voltage in the voltage waveform detected by the voltage sensor 94 during the precharge control. More specifically, when there is an overall drop of the voltage in the voltage waveform detected by the voltage sensor 94, the diagnosis shows that a failure caused by disconnection occurs on the negative electrode side of the battery voltage system. When there is an overall rise of the voltage in the voltage waveform, detected by the voltage sensor 94, on the other hand, the diagnosis shows that a failure caused by disconnection occurs on the positive electrode side of the battery voltage system. When there is no overall change of the voltage in the voltage waveform detected by the voltage sensor 94, the diagnosis snows that a failure caused by disconnection occurs on both the positive electrode side and the negative electrode side of the battery voltage system. This configuration accordingly allows for diagnosis of the place of a failure in the case of inability to pre-charge at the system start time. The result of diagnosis is stored in the flash memory and is thus usable for a subsequent repair. When the battery voltage-system capacitor voltage VL is equal to or higher than the voltage (VB−α), the failure is diagnosed as a failure caused by disconnection in the power control unit PCU.

In the hybrid vehicle 20 equipped with the power supply system according to the embodiment, the insulating resistance drop detection device 90 is connected with the negative electrode terminal of the high-voltage battery 50. According to a modification, the insulating resistance drop detection device 90 may be connected with the positive electrode terminal of the high-voltage battery 50. The common voltages at the positive electrode and the negative electrode of the high-voltage battery 50 similarly drop or rise according to the place of disconnection. This modified configuration that the insulating resistance drop detection device 90 is connected with the positive electrode terminal of the high-voltage battery 50 accordingly provides the similar results.

In the hybrid vehicle 20 equipped with the power supply system according to the embodiment, the place of disconnection is diagnosed, based on an overall change of the voltage in the voltage waveform detected by the voltage sensor 94 of the insulating resistance drop detection device 90. According to a modification, the place of disconnection may be diagnosed, based on changes of the common voltages at the positive electrode and the negative electrode of the high-voltage battery 50. More specifically, when the precharge control performed at the system start time determines the inability to pre-charge and the battery voltage-system capacitor voltage VL is lower than the voltage (VB−α) that is obtained by subtracting the reference value α from the voltage VB of the high-voltage battery 50, in the case of a drop (decrease) of the common voltages at the positive electrode and the negative electrode of the high-voltage battery 50 during the precharge control, the diagnosis shows that a failure caused by disconnection occurs on the negative electrode side of the battery voltage system. In the case of a rise (increase) of the common voltages at the positive electrode and the negative electrode of the high-voltage battery 50 during the precharge control, on the other hand, the diagnosis shows that a failure caused by disconnection occurs on the positive electrode side of the battery voltage system. In the case of no change of the common voltages at the positive electrode and the negative electrode of the high-voltage battery 50 during the precharge control, the diagnosis shows that a failure caused by disconnection occurs on both the positive electrode side and the negative electrode side of the battery voltage system. A failure diagnosis routine illustrated in FIG. 8 may be used for diagnosis of the place of disconnection based on the changes of the common voltages at the positive electrode and the negative electrode of the high-voltage battery 50 during the precharge control.

Figure 8:
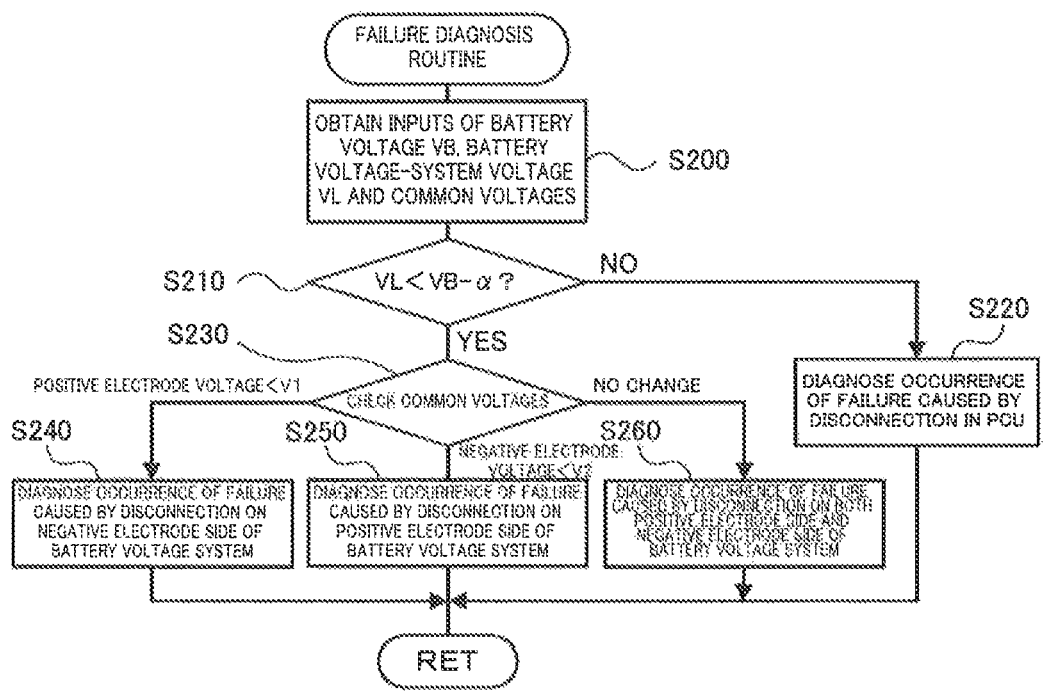
FIG. 8 is a flowchart showing another example of the failure diagnosis system according to a modification.

When the failure diagnosis routine of FIG. 8 is triggered, the HVECU 70 first obtains inputs of the voltage VB of the high-voltage battery 50, the battery voltage-system capacitor voltage VL and the common voltages at the positive electrode and the negative electrode of the high-voltage battery 50 during the precharge control (step S200). The common voltages at the positive electrode and the negative electrode of the high-voltage battery 50 may be construed as a potential at the positive electrode of the high-voltage battery 50 relative to the grounding (ground voltage) and a potential at the negative electrode of the high-voltage battery 50 relative to the grounding (ground voltage) and may thus be detected by using, for example, a voltage sensor configured to detect a voltage between the vehicle body and the positive electrode or HVECU 70 subsequently determines whether the battery voltage-system capacitor voltage VL is lower than the voltage (VB−α) that is obtained by subtracting the reference value α from the voltage VB of the high-voltage battery 50 (step S210). When the battery voltage-system capacitor voltage VL is equal to or higher than the voltage (VB−α), the HVECU 70 diagnoses the occurrence of a failure caused by disconnection in the power control unit PCU (step S220) and terminates this routine. When the battery voltage-system capacitor voltage VL is lower than the voltage (VB−α), on the other hand, the HVECU 70 checks the common voltages at the positive electrode and the negative electrode of the high-voltage battery 50 during the precharge control (step S230). When the common voltage at the positive electrode of the high-voltage battery 50 is lower than a voltage V1 expressed by Equation (1) given below, the HVECU 70 diagnoses the occurrence of a failure caused by disconnection on the negative electrode side of the battery voltage system (step S240). When the common voltage at the negative electrode of the high-voltage battery 50 is lower than a voltage V2 expressed by Equation (2) given below, the HVECU 70 diagnoses the occurrence of a failure caused by disconnection on the positive electrode side of the battery voltage system (step S250). When there are no changes in the common voltages at the positive electrode and the negative electrode of the high-voltage battery 50, the HVECU 70 diagnoses the occurrence of a failure caused by disconnection on both the positive electrode side and the negative electrode side of the battery voltage system (step S260). In Equation (1) and Equation (2), VB denotes a voltage of the high-voltage battery 50; R1 denotes a resistance of the high-voltage battery 50 and from the positive electrode of the high-voltage battery 50 to a positive electrode-side terminal of the capacitor 53; R2 denotes a resistance from the negative electrode of the high-voltage battery 50 to a negative electrode-side terminal of the capacitor 58; R3 denotes a resistance of the capacitor 58 and the entire circuit on the right side of the capacitor 58 shown in FIG. 2; and ΔV denotes a sensor error.

$$V1 = VB(R1 \cdot R3/(R1+R3))/(R1 \cdot R3)/(R1+R3)+R2) + \Delta V \quad (1)$$

$$V2 = VB(R2 \cdot R3/(R2+R3))/(R2 \cdot R3)/(R2+R3)+R1) + \Delta V \quad (2)$$

The power supply system of the embodiment is configured to include the high-voltage battery 50, the system main relay 56, the battery voltage-system power lines 54b, the capacitor 58, the boost converter 55, the drive voltage-system power lines 54a, the capacitor 57, the inverters 41 and 42, the HVECU 70, the motor ECU 40, the battery ECU 52 and the insulating resistance drop detection device 90. According to a modification, the power supply system may be configured to exclude the boost converter 55 and the capacitor 57. In this modified configuration, the battery voltage-system power lines 54b and the drive voltage-system power lines 54a serve as single power lines.

The power supply system of the embodiment is configured to include the inverters 41 and 42 that are used to drive the motor MG1 and the motor MG2. According to a modification, the power supply system may be configured to include one inverter that is used to drive a single motor or to include three or more inverters that are used to drive three or more motors.

The above embodiment describes the hybrid vehicle 20 that is equipped with the power supply system. The power supply system may, however, be mounted on a hybrid vehicle having any of other various configurations or may be mounted on an electric vehicle without an engine.

The power supply system according to the aspect of the present disclosure described above may further comprise an insulating resistance drop detection circuit mounted to a positive electrode side or a negative electrode side of the accumulator and configured to detect a drop of an insulating resistance of the vehicle. The control device may diagnose occurrence of a failure caused by disconnection on a negative electrode side from the accumulator to the capacitor, in response to a decrease in voltage of the insulating resistance drop detection circuit during the precharge control, may diagnose occurrence of a failure caused by disconnection on a positive electrode side from the accumulator to the capacitor, in response to an increase in the voltage of the insulating resistance drop detection circuit during the precharge control, and may diagnose occurrence of a failure caused by disconnection on both the positive electrode side and the negative electrode side from the accumulator to the capacitor, in response to no change in the voltage of the insulating resistance drop detection circuit during the precharge control. When a failure caused by disconnection occurs on the negative electrode side of the power line, the power converter and the electric load are connected with only the positive electrode side of the accumulator due to disconnection on the negative electrode side of the power line. Performing the precharge control in this state decreases the common voltage on the positive electrode side of the accumulator. In this case, since the output voltage of the accumulator has no change, this results in decreasing the common voltage on the negative electrode side of the accumulator. This accordingly decreases the voltage of the insulating resistance drop detection circuit mounted to the positive electrode side or the negative electrode side of the accumulator. In response to a decrease in the voltage of the insulating resistance drop detection circuit during the precharge control, the power supply system of this aspect determines that a decreasing change of the common voltage is attributed to the occurrence of a failure caused by disconnection on the negative electrode side of the power line and accordingly diagnoses the occurrence of a failure caused by disconnection on the negative electrode side of the power line. When a failure caused by disconnection occurs on the positive electrode side of the power line, on the other hand, the power converter and the electric load are connected with only the negative electrode side of the accumulator due to disconnection on the positive electrode side of the power line. Performing the precharge control in this state increases the common voltage on the negative electrode side of the accumulator. In this case, since the output voltage of the accumulator has no change, this results in increasing the common voltage on the positive electrode side of the accumulator. This accordingly increases the voltage of the insulating resistance drop detection circuit mounted to the positive electrode side or the negative electrode side of the accumulator. In response to an increase in the voltage of the insulating resistance drop detection circuit during the precharge control, the power supply system of this aspect determines that an increasing change of the common voltage is attributed to the occurrence of a failure caused by disconnection on the positive electrode side of the power line and accordingly diagnoses the occurrence of a failure caused by disconnection on the positive electrode side of the power line. When a failure caused by disconnection occurs on both the positive electrode side and the negative electrode side of the power line, no component or load is connected with the positive electrode side or the negative electrode side of the accumulator due to disconnection on both the positive electrode side and the negative electrode side of the power line. Performing the precharge control in this state provides no change of the common voltage. This accordingly provides no change in the voltage of the insulating resistance drop detection circuit mounted to the positive electrode side or the negative electrode side of the accumulator. In response to no change in the voltage of the insulating resistance drop detection circuit during the precharge control, the power supply system of this aspect accordingly diagnoses the occurrence of a failure caused by disconnection on both the positive electrode side and the negative electrode side of the power line.

In the power supply system of the above aspect of the present disclosure, the control device may diagnose occurrence of a failure caused by disconnection on a negative electrode side from the accumulator to the capacitor, in response to a decrease in common voltage of the accumulator during the precharge control, may diagnose occurrence of a failure caused by disconnection on a positive electrode side from the accumulator to the capacitor, in response to an increase in the common voltage of the accumulator during the precharge control, and may diagnose occurrence of a failure caused by disconnection on both the positive electrode side and the negative electrode side from the accumulator to the capacitor, in response to no change in the common voltage of the accumulator during the precharge control. When a failure caused by disconnection occurs on the negative electrode side of the power line, the power converter and the electric load are connected with only the positive electrode side of the accumulator due to disconnection on the negative electrode side of the power line. Performing the precharge control in this state decreases the common voltage on the positive electrode side of the accumulator and thereby also decreases the common voltage on the negative electrode side of the accumulator. In response to a decrease in the common voltage of the accumulator during the precharge control, the power supply system of this aspect accordingly diagnoses the occurrence of a failure caused by disconnection on the negative electrode side of the power line. When a failure caused by disconnection occurs on the positive electrode side of the power line, on the other hand, the power converter and the electric load are connected with only the negative electrode side of the accumulator due to disconnection on the positive electrode side of the power line. Performing the precharge control in this state increases the common voltage on the negative electrode side of the accumulator and thereby also increases the common voltage on the positive electrode side of the accumulator. In response to an increase in the common voltage of the accumulator during the precharge control, the power supply system of this aspect accordingly diagnoses the occurrence of a failure caused by disconnection on the positive electrode side of the power line. When a failure caused by disconnection occurs on both the positive electrode side and the negative electrode side of the power line, no component or load is connected with the positive electrode side or the negative electrode side of the accumulator due to disconnection on both the positive electrode side and the negative electrode side of the power line. Performing the precharge control in this state provides no change of the common voltage, in response to no change in the common voltage of the accumulator during the precharge control, the power supply system of this aspect accordingly diagnoses the occurrence of a failure caused by disconnection on both the positive electrode side and the negative electrode side of the power line. In the power supply system of this aspect, the control device may diagnose the occurrence of a failure caused by disconnection on the negative electrode side from the accumulator to the capacitor when a positive electrode-side voltage of the common voltage of the accumulator is lower than a first voltage that is V1 expressed by Equation (1) given above, may diagnose the occurrence of a failure caused by disconnection on the positive electrode side from the accumulator to the capacitor when a negative electrode-side voltage of the common voltage of the accumulator is lower than a second voltage that, is V2 expressed by Equation (2) given above, and may diagnose the occurrence of a failure caused by disconnection on both the positive electrode side and the negative electrode side from the accumulator to the capacitor when the positive electrode-side voltage of the common voltage of the accumulator is equal to or higher than the first voltage and the negative electrode-side voltage of the common voltage of the accumulator is equal to or higher than the second voltage. In Equations (1) and (2) given above, VB denotes an output voltage of the accumulator; R1 denotes a resistance of the accumulator and from a positive electrode of the accumulator to a positive electrode-side relay of the system main relay; R2 denotes a resistance from a negative electrode of the accumulator to the precharge circuit and to a negative electrode-side relay of the system main relay; R3 denotes a resistance from the capacitor to the electric load; and $\Delta V$ denotes a sensor error. The power supply system of this aspect can readily detect a change in the common voltage and thereby diagnose the place of a failure.

The power supply system of the above aspect of the present disclosure may further comprise a boost circuit configured to step up the DC power of the power line and supply the stepped-up voltage to a second power line; and a second smoothing capacitor mounted, to the power line. The power converter may convert a DC power of the second power line to an AC power and supply the AC power to the electric load. At least the boost circuit, the second capacitor and the power converter may constitute a power control unit. When the precharge control succeeds in pre-charging the capacitor but fails in pre-charging the second capacitor, the control device may diagnose occurrence of a failure caused by disconnection in the power control unit. When the precharge control, succeeds in pre-charging the capacitor but fails in pre-charging the second capacitor, the power supply system of this aspect diagnoses the place of a failure as inside of the power control unit.

The following describes the correspondence relationship between the primary elements of the above embodiment and the primary elements of the present disclosure described in Summary. The system main relay 56 of the embodiments corresponds to the "system main relay", the high-voltage battery 50 corresponds to the "accumulator", and the capacitor 58 corresponds to the "capacitor". The motors MG1 and MG2 correspond to the "electric load", and the inverters 41 and 42 correspond to the "power converter". The HVECU 70, the motor ECU 40 and the battery ECU 52 correspond to the "control device".

The "accumulator" is not limited to the battery but may be any device configured to accumulate electric power, such as a capacitor. The "electric load" is not limited to the motors MG1 and MG2 but may be any load configured to consume electric power. The "power converter" is not limited to the inverter but may be any power converter of a different configuration. The "control device" is not limited to the combination of the HVECU 70, the motor ECU 40 and the battery ECU 52 but may be configured by a single electronic control unit.

The correspondence relationship between the primary components of the embodiment and the primary components of the present disclosure, regarding which the problem is described in Summary, should not be considered to limit the components of the present disclosure, regarding which the problem is described in Summary, since the embodiment is only illustrative to specifically describes the aspects of the present disclosure, regarding which the problem is described in Summary. In other words, the present disclosure, regarding which the problem is described in Summary, should be interpreted on the basis of the description in Summary, and the embodiment is only a specific example of the present disclosure, regarding which the problem is described in Summary.

The aspect of the present disclosure is described above with reference to the embodiment. The present disclosure is, however, not limited to the above embodiment but various modifications and variations may be made to the embodiment without departing from the scope of the present disclosure.

INDUSTRIAL APPLICABILITY

The present disclosure is applicable to, for example, the manufacturing industry of the power supply system.

The invention claimed is:

1. A power supply system mounted on a vehicle, the power supply system comprising:
   an accumulator connected with a power line via a system main relay that includes a precharge circuit;
   a smoothing capacitor mounted to the power line;
   a power converter configured to use a DC power from, the power line and supply an AC power to an electric load; and
   a control device configured to perform, a precharge control that uses the precharge circuit to pre-charge the smoothing capacitor at a system start time, wherein
   when the precharge control fails in pre-charging the smoothing capacitor, the control device diagnoses a place of a failure, based on a change in a common voltage of the accumulator during the precharge control.

2. The power supply system according to claim 1, further comprising:
   an insulating resistance drop detection circuit mounted to a positive electrode side or a negative electrode side of the accumulator and configured to detect a drop of an insulating resistance of the vehicle, wherein
   the control, device diagnoses occurrence of a failure caused by disconnection on a negative electrode side from the accumulator to the smoothing capacitor, in response to a decrease in a voltage of the insulating resistance drop detection circuit during the precharge control, diagnoses occurrence of a failure caused by disconnection on a positive electrode side from the accumulator to the smoothing capacitor, in response to an increase in the voltage of the insulating resistance drop detection circuit during the precharge control, and diagnoses occurrence of a failure caused by disconnection on both the positive electrode side and the negative electrode side from the accumulator to the smoothing capacitor, in response to no change in the voltage of the insulating resistance drop detection circuit during the precharge control.

3. The power supply system according to claim 1, wherein the control device diagnoses occurrence of a failure caused by disconnection on a negative electrode side from the accumulator to the smoothing capacitor, in response to a decrease in the common voltage of the accumulator during the precharge control, diagnoses occurrence of a failure caused by disconnection on a positive electrode side from the accumulator to the smoothing capacitor, in response to an increase in the common voltage of the accumulator during the precharge control, and diagnoses occurrence of a failure caused by disconnection on both the positive electrode side and the negative electrode side from the accumulator to the smoothing capacitor, in response to no change in the common voltage of the accumulator during the precharge control.

4. The power supply system according to claim 3, wherein the control device diagnoses the occurrence of a failure caused by the disconnection on the negative electrode side from the accumulator to the smoothing capacitor when a positive electrode-side voltage of the common voltage of the accumulator is lower than a first voltage that is V1 expressed by Equation (1), diagnoses the occurrence of a failure caused by the disconnection on the positive electrode side from the accumulator to the smoothing capacitor when a negative electrode-side voltage of the common voltage of the accumulator is lower than a second voltage that is V2 expressed by Equation (2), and diagnoses the occurrence of a failure caused by the disconnection on both the positive electrode side and the negative electrode side from the accumulator to the smoothing capacitor when the positive electrode-side voltage of the common voltage of the accumulator is equal to or higher than the first voltage and the negative electrode-side voltage of the common voltage of the accumulator is equal to or higher than the second voltage, $$V1 = VB(R1 \cdot R3/(R1+R3))/(R1 \cdot R3)/(R1+R3)+R2)+\Delta V \quad (1)$$

$$V2 = VB(R2 \cdot R3/(R2+R3))/(R2 \cdot R3)/(R2+R3)+R1)+\Delta V \quad (2)$$

where VB denotes an output voltage of the accumulator; R1 denotes a resistance of the accumulator and from a positive electrode of the accumulator to a positive electrode-side relay of the system main relay; R2 denotes a resistance from a negative electrode of the accumulator to the precharge circuit and to a negative electrode-side relay of the system main relay; R3 denotes a resistance from, the smoothing capacitor to the electric load; and $\Delta V$ denotes a sensor error.

5. The power supply system according to claim 1, further comprising:
   a boost circuit configured to step up the DC power of the power line and supply the stepped-up voltage to a second power line; and
   a second smoothing capacitor mounted to the second power line, wherein the power converter converts a DC power of the second power line to a second AC power and supply the second AC power to the electric load, at least the boost circuit, the second capacitor and the power converter constitute a power control unit, and when the precharge control succeeds in pre-charging the smoothing capacitor but fails in pre-charging the second smoothing capacitor, the control device diagnoses occurrence of a failure caused by disconnection in the power control unit.

6. The power supply system according to claim 2, further comprising:

a boost circuit configured to step up the DC power of the power line and supply the stepped-up voltage to a second power line; and a second smoothing capacitor mounted to second power line, wherein the power converter converts a DC power of the second power line to a second AC power and supply the second AC power to the electric load, at least the boost circuit, the second smoothing capacitor and the power converter constitute a power control unit, and when the precharge control succeeds In pre-charging the smoothing capacitor but fails in pre-charging the second smoothing capacitor, the control device diagnoses occurrence of a failure caused by disconnection in the power control unit.

7. The power supply system according to claim 3, further comprising:

a boost circuit configured to step up the DC power of the power line and supply the stepped up voltage to a second power line; and a second smoothing capacitor mounted to the second power line, wherein the power converter converts a DC power of the second power line to a second AC power and supply the second AC power to the electric load, at least the boost circuit, the second smoothing capacitor and the power converter constitute a power control unit, and when the precharge control succeeds in pre-charging the smoothing capacitor but fails in pre-charging the second smoothing capacitor, the control device diagnoses occurrence of a failure caused by disconnection in the power control unit.

8. The power supply system according to claim 4, further comprising:

a boost circuit configured to step up the DC power of the power line and supply the stepped-up voltage to a second power line; and a second smoothing capacitor mounted to the second power line, wherein the power converter converts a DC power of the second power line to a second AC power and supply the second AC power to the electric load, at least the boost circuit, the second smoothing capacitor and the power converter constitute a power control unit, and when the precharge control succeeds in pre-charging the smoothing capacitor but fails in pre-charging the second smoothing capacitor, the control device diagnoses occurrence of a failure caused by disconnection in the power control unit.

\* \* \* \* \*